United States Patent [19]

Subramanian

[11] Patent Number: 5,017,554
[45] Date of Patent: May 21, 1991

[54] SUPERCONDUCTING METAL OXIDE TL-PB-CA-SR-CU-O COMPOSITIONS AND PROCESSES FOR MANUFACTURE AND USE

[75] Inventor: Munirpallam A. Subramanian, New Castle, Del.

[73] Assignee: E. I. Du Pont de Nemours and Company, Wilmington, Del.

[21] Appl. No.: 415,679

[22] Filed: Aug. 15, 1989

Related U.S. Application Data

[60] Division of Ser. No. 236,088, Aug. 24, 1988, and a continuation-in-part of Ser. No. 230,631, Aug. 10, 1988.

[51] Int. Cl.$^5$ .................. C01F 11/02; C01G 3/02; C01G 21/00; H01L 39/12
[52] U.S. Cl. .................. 505/1; 252/521; 423/605; 423/618; 423/624; 423/635; 501/94; 501/123; 501/126; 505/775; 505/783
[58] Field of Search .................. 505/1, 783, 775; 423/605, 618, 624, 635; 501/94, 123, 126; 252/521

[56] References Cited

U.S. PATENT DOCUMENTS

| | | | |
|---|---|---|---|
| 3,932,315 | 1/1976 | Sleight | 252/521 |
| 4,412,902 | 11/1983 | Michikami et al. | 204/192 |
| 4,880,771 | 11/1989 | Cava | 505/1 |
| 4,894,361 | 1/1990 | Subramanian | 505/1 |

OTHER PUBLICATIONS

Bednorz et al., Z. Phys. B64, 189 (1986).
Rao et al., Current Science, 56, 47 (1987).
Chu et al., Science 235, 567 (1987).
Chu et al., Phys. Rev. Lett. 58, 405, (1987).
Cava et al., Phys. Rev. Lett. 58, 408 (1987).
Bednorz et al., Europhys. Lett. 3, 379 (1987).
Wu et al., Phys. Rev. Lett., 58, 908 (1987).
Cava et al., Phys. Rev. Lett. 58, 1676 (1987).
Michel et al., Z. Phys. B—Condensed Matter 58, 421 (1987).
Maeda et al., Jpn. J. Appl. Phys. 27, L209 (1988).
Subramanian et al., Science 239, 1015 (1988).
Yamada et al., Jpn. J. Appl. Phys. 27, L996 (1988).
Takano et al., Jpn. J. Appl. Phys. 27, L1041 (1988).
Mizuno et al., Jpn. J. Appl. Phys. 27, L1225 (1988).
Sampathkumaran et al., J. Phys. F: Met. Phys. 18, L163 (1988).
Sheng et al., Nature 332, 55 (1988).
Sheng et al., Nature 332, 138 (1988).
Hazen et al., Phys. Rev. Lett. 60, 1657 (1988).
Gubser et al., Physical Review B, vol. 35, No. 10, pp. 5350–5352 (1987).
Richert et al., American Vacuum Society Series 3, American Institute of Physics Conf. Proceedings No. 165, pp. 277–283 (1988).

*Primary Examiner*—Paul Lieberman
*Assistant Examiner*—John Boyd

[57] ABSTRACT

Compositions having the nominal formula $$Tl_ePb_aCa_bSr_cCu_dO_x$$

wherein a is from about 1/10 to 3/2,
  b is from about 1 to 4,
  c is from about 1 to 3
  d is from about 1 to 5
  e is from about 3/10 to 1
  $x = (a+b+c+d+e+y)$ where y is from about ½ to 3,
are superconducting. Processes for manufacturing such compositions and for using them are disclosed.

15 Claims, 1 Drawing Sheet

SUPERCONDUCTING METAL OXIDE TL-PB-CA-SR-CU-O COMPOSITIONS AND PROCESSES FOR MANUFACTURE AND USE

This is a division of application Ser. No. 07/236,088, filed Aug. 24, 1988.

BACKGROUND OF THE INVENTION

1. Field of the Invention

This invention relates to novel Tl—Pb—Ca—Sr—Cu—O compositions which are superconducting.

2. References

Bednorz and Muller, Z. Phys. B64, 189 (1986), disclose a superconducting phase in the La—Ba—Cu—O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Wu et al., Phys. Rev. Lett 58, 908 (1987), disclose a superconducting phase in the Y—Ba—Cu—O system with a superconducting transition temperature of about 90 K. Cava et al., Phys. Rev. Lett. 58, 1676 (1987), have identified this superconducting Y—Ba—Cu—O phase to be orthorhombic, distorted, oxygen-deficient perovskite $YBa_2Cu_3O_{9-\delta}$ where $\delta$ is about 2.1 and present the powder x-ray diffraction pattern and lattice parameters.

C. Michel et al., Z. Phys. B—Condensed Matter 68, 421 (1987), disclose a novel family of superconducting oxides in the Bi—Sr—Cu—O system with composition close to $Bi_2Sr_2Cu_2O_{7+\delta}$. A pure phase was isolated for the composition $Bi_2Sr_2Cu_2O_{7+\delta}$. The X-ray diffraction pattern for this material exhibits some similarity with that of perovskite and the electron diffraction pattern shows the perovskite subcell with the orthorhombic cell parameters of a=5.32 A (0.532 nm), b=26.6 A (2.66 nm) and c=48.8 A (4.88 nm). The material made from ultrapure oxides has a superconducting transition with a midpoint of 22 K. as determined from resistivity measurements and zero resistance below 14 K. The material made from commercial grade oxides has a superconducting transition with a midpoint of 7 K.

H. Maeda et al., Jpn. J. Appl. Phys. 27, L209 (1988), disclose a superconducting oxide in the Bi—Sr—Ca—Cu—O system with the composition near $BiSrCaCu_2O_x$ and a superconducting transition temperature of about 105 K.

The commonly assigned application, "Superconducting Metal Oxide Compositions and Process For Making Them", Ser. No. 153,107, filed Feb. 8, 1988, a continuation-in-part of Ser. No. 152,186, filed Feb. 4, 1988, disclose superconducting compositions having the nominal formula $Bi_aSr_bCa_cCu_3O_x$ wherein a is from about 1 to about 3, b is from about $\frac{3}{8}$ to about 4, c is from about 3/16 to about 2 and $x=(1.5\,a+b+c+y)$ where y is from about 2 to about 5, with the proviso that b+c is from about 3/2 to about 5, said compositions having superconducting transition temperatures of about 70 K. or higher. It also discloses the superconducting metal oxide phase having the formula $Bi_2Sr_{3-z}Ca_zCu_2O_{8+w}$ wherein z is from about 0.1 to about 0.9, preferably 0.4 to 0.8 and w is greater than zero but less than about 1. M. A. Subramanian et al., Science 239, 1015 (1988) also disclose the $Bi_2Sr_{3-z}Ca_zCu_2O_{8+w}$ superconductor.

Y. Yumada et al., Jpn. J. Appl. Phys. 27, L996 (1988), disclose the substitution of Pb for Bi in the series $Bi_{1-x}Pb_xSrCaCu_2O_y$ where x=0, 0.1, 0.3, 0.5, 0.7, 0.9 and 1.0. The $T_c$ increases from 75.5 K. for x=0, no Pb present, to a maximum of 85.5 K. for x=0.5. $T_c$ decreases for higher Pb content to 76 K. for x=0.7. No superconductivity was observed for the samples with x=0.9 and x=1.

M. Takano et al., Jpn. J. Appl. Phys. 27, L1041 (1988), disclose that partial substitution of Pb for Bi in the Bi—Sr—Ca—Cu—O system results in an increase in the volume fraction of the high $T_c$ phase. Coprecipitated oxalates containing the relevant ions in various ratios underwent thermal decomposition below 773 K. The samples in powder form were then heated in air to 1073 K. for 12 hours and, after being formed into pellets, at 1118 K. for various periods which extended to more than 240 hours in some cases. A starting composition of Bi:Pb:Sr:Ca:Cu=0.7:0.3:1:1:1:8 was heated at 1118 K. for 244 hours. The high-$T_c$ phase shows an onset of superconductivity at around 115 K. This phase forms plate-like crystals and analysis of these crystals indicates that the cationic ratio is Bi:Pb:Sr:Ca:Cu=67:5:100:85:180 so that there is considerably less Pb in the high-$T_c$ than in the starting material.

M. Mizuno et al., Jpn. J. Appl. Phys. 27, L1225 (1988), also disclose that the addition of Pb to the Bi—Sr—Ca—Cu—O system results in an increase in the volume fraction of the high-$T_c$ phase and a lowering of the optimum temperature to obtain this phase to about 855° C.

E. V. Sampathkumaran et al., J. Phys. F: Met. Phys. 18, L163 (1988) disclose that the partial substitution of K or Pb for Bi in the $Bi_4Ca_3Sr_3Cu_4O_4$ results in an enhancement of the fraction of the phase superconducting at about 110 K.

Z. Z. Sheng et al., Nature 332, 55 (1988) disclose superconductivity in the Tl—Ba—Cu—O system in samples which have nominal compositions $Tl_2Ba_2Cu_3O_{8+x}$ and $TlBaCu_3O_{5.5+x}$. Both samples are reported to have onset temperatures above 90 K. and zero resistance at 81 K. The samples were prepared by mixing and grinding appropriate amounts of $BaCO_3$ and CuO with an agate mortar and pestle. This mixture was heated in air at 925° C. for more than 24 hours with several intermediate grindings to obtain a uniform black oxide Ba—Cu oxide powder which was mixed with an appropriate amount of $Tl_2O_3$, completely ground and pressed into a pellet with a diameter of 7 mm and a thickness of 1-2 mm. The pellet was then put into a tube furnace which had been heated to 880°-910° C. and was heated for 2-5 minutes in flowing oxygen. As soon as it had slightly melted, the sample was taken from the furnace and quenched in air to room temperature. It was noted by visual inspection that $Tl_2O_3$ had partially volatilized as black smoke, part had become a light yellow liquid, and part had reacted with Ba—Cu oxide forming a black, partially melted, porous material.

Z. Z. Sheng et al., Nature 332, 138 (1988) disclose superconductivity in the Tl—Ca—Ba—Cu—O system in samples which have nominal compositions $Tl_2Ca_2BaCu_3O_{9+x}$.

R. M. Hazen et al., Phys. Rev. Lett. 60, 1657 (1988), disclose two superconducting phases in the Tl—Ba—Ca—Cu—O system, $Tl_2Ba_2Ca_2Cu_3O_{10}$ and $Tl_2Ba_2CaCu_2O_8$.

SUMMARY OF THE INVENTION

This invention provides novel superconducting compositions having the nominal formula $Tl_ePb_aCa_bSr_cCu_dO_x$ wherein a is from about 1/10 to about 3/2, b is from about 1 to about 4, c is from about 1 to about 3, d is from about 1 to about 5, e is from about 3/10 to about 1 and $x=(a+b+c+d+e+y)$ where y is from about ½ to about 3. Preferably, the sum of a+e is about 1, b is about 2, c is about 2, d is from about 3 to about 4 and y is from about ½ to about 2. The onset of superconductivity for these compositions is at least 70 K.

This invention includes novel superconducting compositions having the nominal formula $TlPb_aCa_bSr_cCu_dO_x$ wherein a is from about ½ to about 3/2, b is from about 1 to about 4, c is from about 1 to about 3, d is from about 1 to about 5 and $x=(a+b+c+d+y)$ where y is from about ½ to about 3. Preferably, a is about 1, b is from about 1 to about 2, c is about 1, d is from about 3 to about 4 and y is from about ½ to about 2. The onset of superconductivity for these compositions is at least 70 K.

These superconducting compositions are prepared by heating a mixture of the Tl, Pb, Ca, Sr and Cu oxides, the relative amounts chosen so that the atomic ratio Tl:Pb:Ca Sr:Cu is e:a:b:c:d, at a temperature of about 850° C. to about 940° C., preferably about 860° C. to about 925° C., for about 3 to 12 hours in a confined atmosphere, e.g., in a sealed tube made of a non-reacting metal such as gold which prevents any of the reactants including the metals and oxygen from escaping.

DETAILED DESCRIPTION OF THE INVENTION

Figure 1:
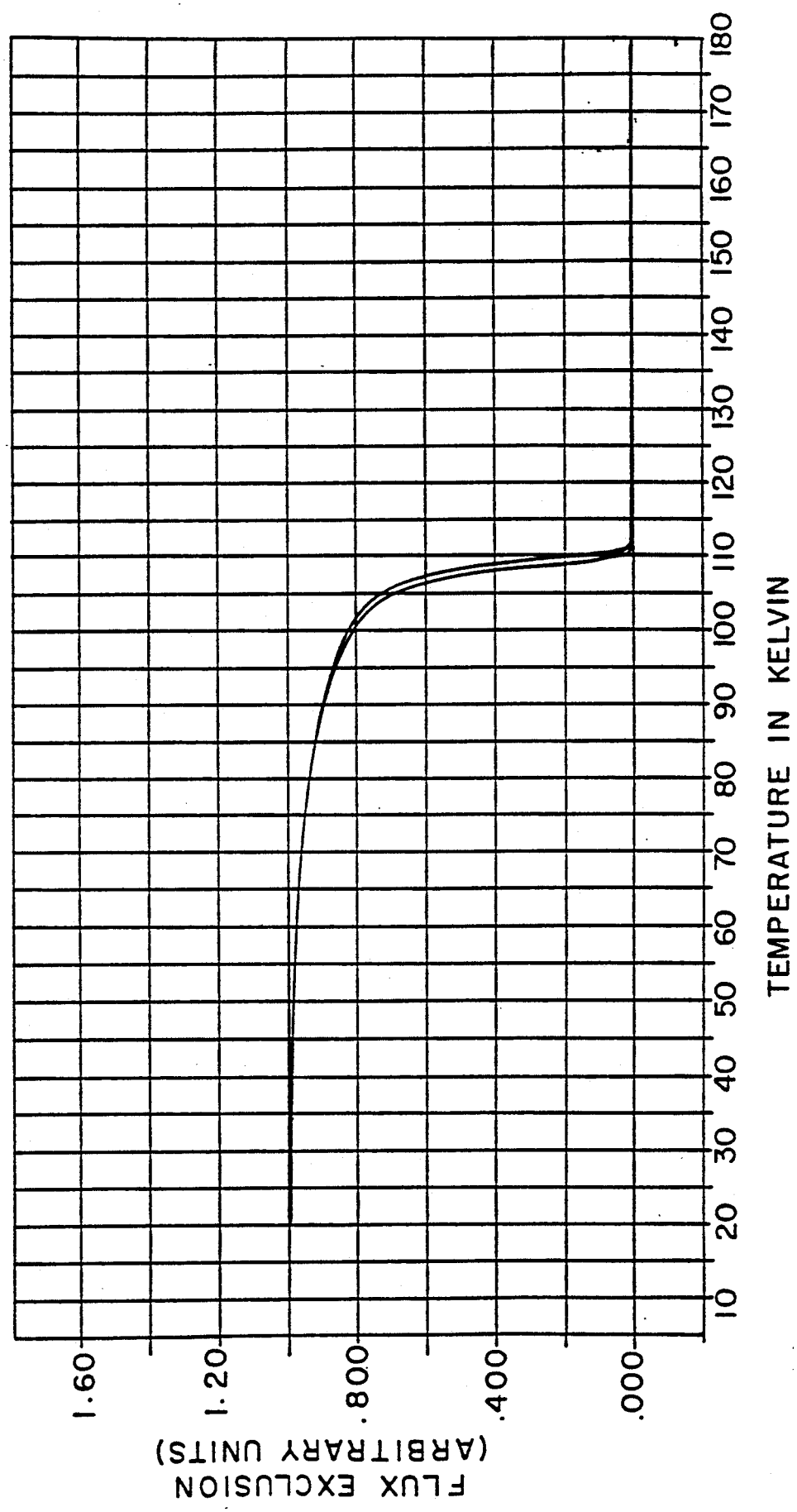
FIG. 1 shows a plot of the flux excluded by a composition of this invention as a function of temperature.

The superconducting compositions of this invention are prepared by the following process. Quantities of the oxide reactants $Tl_2O_3$, $PbO_2$, $CaO_2$, $SrO_2$ and CuO are chosen with the atomic ratio of Tl:Pb:Ca:Sr:Cu of e:a:b:c:d wherein a is from about 1/10 to about 3/2, b is from about 1 to about 4, c is from about 1 to about 3, d is from about 1 to about 5, e is from about 3/10 to about 1, and mixed, for example, by grinding them together in a mortar. The mixed powder may then be heated directly or it can be first formed into a pellet or other shaped object and then heated. The superconducting composition of this invention is produced only when the atmosphere in which the reactants are heated is carefully controlled. One way to accomplish this controlled atmosphere is to place the reactants in a tube made of a non-reacting metal such as gold and then sealing the tube by welding. The sealed tube is then placed in a furnace and heated to about 850° C. to about 940° C. for about 3 to 12 hours. The power to the furnace is then turned off and the tube is furnace-cooled to ambient temperature, about 20° C., and then removed from the furnace. The tube is then opened and the black product recovered. The compositions prepared in this manner exhibit the onset of superconductivity above 70 K.

Two superconducting phases have been identified in these superconducting compositions One phase, the "12 Angstrom phase", has an onset of superconductivity of about 85 K. and lattice parameters of a=0.380 nm and c=1.21 nm as determined from X-ray powder diffraction results indexed on a tetragonal cell and the other phase, the "15 Angstrom phase", has an onset of superconductivity of about 120 K. and lattice parameters of a=0.380 nm and c=1.52 nm as determined from X-ray powder diffraction results indexed on a tetragonal cell.

Superconductivity can be confirmed by observing magnetic flux exclusion, i.e., the Meissner effect. This effect can be measured by the method described in an article by E. Polturak and B. Fisher in Physical Review B, 36, 5586(1987).

The superconducting compositions of this invention can be used to conduct current extremely efficiently or to provide a magnetic field for magnetic imaging for medical purposes. Thus, by cooling the composition in the form of a wire or bar to a temperature below the superconducting transition temperature, ($T_c$) by exposing the material to liquid nitrogen if $T_c$ is above 77 K. or to liquid helium if $T_c$ is below 77 K. in a manner well known to those in this field; and initiating a flow of electrical current, one can obtain such flow without any electrical resistive losses. To provide exceptionally high magnetic fields with minimal power losses, the wire mentioned previously could be wound to form a coil which would be exposed to liquid helium or liquid nitrogen, depending on $T_c$ before inducing any current into the coil. Such fields can be used to levitate objects as large as railroad cars. These superconducting compositions are also useful in Josephson devices such as SQUIDS (superconducting quantum interference devices) and in instruments that are based on the Josephson effect such as high speed sampling circuits and voltage standards.

EXAMPLES OF THE INVENTION

EXAMPLE 1

2.2837 g of $Tl_2O_3$, 2.3919 g of $PbO_2$, 0.7208 g of $CaO_2$, 1.1962 g of $SrO_2$ and 0.7954 g of CuO, corresponding to a Tl:Pb:Ca:Sr:Cu atomic ratio of 1:1:1:1:1, were ground together in an agate mortar for about 30 minutes. Pellets, 10 mm in diameter and about 3 mm thick, were pressed from this mixed powder. Two pellets were loaded into a gold tube (⅜" dia and 4" long) and the tube was sealed by welding both ends. The tube was placed in a furnace and heated at a rate of 5° C. per minute to 875° C. and then held at 875° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 75 K.

EXAMPLE 2

Two other pellets of the mixed powder of Example 1 were treated as described in Example 1 except that the temperature to which they were heated and held was 925° C.

Meissner effect measurements showed the onset of superconductivity at about 70 K.

EXAMPLE 3

2.2837 g of $Tl_2O_3$, 2.3919 g of $PbO_2$, 1.1416 g of $CaO_2$, 1.1962 g of $SrO_2$ and 2.3862 g of CuO, corresponding to a Tl:Pb:Ca:Sr:Cu atomic ratio of 1:1:2:1:3, were ground together in an agate mortar for about 30 minutes. Pellets, 10 mm in diameter and about 3 mm thick, were pressed from this mixed powder. Two pellets were loaded into a gold tube (⅜" dia and 4" long) and the tube was sealed by welding both ends. The tube was placed in a furnace and heated at a rate of 5° C. per minute to 875° C. and then held at 875° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 80 K.

EXAMPLE 4

Two other pellets of the mixed powder of Example 3 were treated as described in Example 3 except that the temperature to which they were heated and held was 925° C.

Meissner effect measurements were carried out and the results are shown in FIG. 1 where the flux exclusion is plotted as a function of temperature. The plot shows the onset of superconductivity at about 110 K.

The X ray powder diffraction of the product shows that the dominant phase is the 15 Angstrom phase.

EXAMPLE 5

2.2837 g of $Tl_2O_3$, 2.3919 g of $PbO_2$, 0.7208 g of $CaO_2$, 1.1962 g of $SrO_2$ and 2.3862 g of CuO, corresponding to a Tl:Pb:Ca:Sr:Cu atomic ratio of 1:1:1:1:3, were ground together in an agate mortar for about 30 minutes. Pellets, 10 mm in diameter and about 3 mm thick, were pressed from this mixed powder. Two pellets were loaded into a gold tube (⅜" dia and 4" long) and the tube was sealed by welding both ends. The tube was placed in a furnace and heated at a rate of 5° C. per minute to 875° C. and then held at 875° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 85 K.

The X-ray powder diffraction of the product shows that the dominant phase is the 12 Angstrom phase.

EXAMPLE 6

Two other pellets of the mixed powder of Example 5 were treated as described in Example 5 except that the temperature to which they were heated and held was 925° C.

Meissner effect measurements showed the onset of superconductivity at about 120 K.

The X-ray powder diffraction of the product shows that the dominant phase is the 15 Angstrom phase.

EXAMPLE 7

2.2837 g of $Tl_2O_3$, 2.3919 g of $PbO_2$, 0.7208 g of $CaO_2$, 1.1962 g of $SrO_2$ and 1.5908 g of CuO, corresponding to a Tl:Pb:Ca:Sr:Cu atomic ratio of 1:1:1:1:2, were ground together in an agate mortar for about 30 minutes. Pellets, 10 mm in diameter and about 3 mm thick, were pressed from this mixed powder. Two pellets were loaded into a gold tube (⅜" dia and 4" long) and the tube was sealed by welding both ends. The tube was placed in a furnace and heated at a rate of 5° C. per minute to 875° C. and then held at 875° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 80 K.

The X-ray powder diffraction of the product shows that the dominant phase is the 12 Angstrom phase.

EXAMPLE 8

Two other pellets of the mixed powder of Example 7 were treated as described in Example 7 except that the temperature to which they were heated and held was 925° C.

Meissner effect measurements showed the onset of superconductivity at about 85 K.

The X ray powder diffraction of the product shows that the dominant phase is the 12 Angstrom phase.

EXAMPLE 9

2.2837 g of $Tl_2O_3$, 2.3919 g of $PbO_2$, 0.7208 g of $CaO_2$, 2.3924 g of $SrO_2$ and 2.3862 g of CuO, corresponding to a Tl:Pb:Ca:Sr:Cu atomic ratio of 1:1:1:2:3, were ground together in an agate mortar for about 30 minutes. Pellets, 10 mm in diameter and about 3 mm thick, were pressed from this mixed powder. Two pellets were loaded into a gold tube (⅜" dia and 4" long) and the tube was sealed by welding both ends. The tube was placed in a furnace and heated at a rate of 5° C. per minute to 860° C. and then held at 860° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 80 K.

The X ray powder diffraction of the product shows that the dominant phase is the 12 Angstrom phase.

EXAMPLE 10

Two other pellets of the mixed powder of Example 9 were treated as described in Example 9 except that the temperature to which they were heated and held was 890° C.

Meissner effect measurements showed the onset of superconductivity at about 80 K.

The X-ray powder diffraction of the product shows that the dominant phase is the 12 Angstrom phase.

EXAMPLES 11

0.6851 g of $Tl_2O_3$, 1.6743 g of $PbO_2$, 1.4416 g of $CaO_2$, 2.3924 g of $SrO_2$ and 2.3862 g of CuO, corresponding to a Tl:Pb:Ca:Sr:Cu atomic ratio of 3/10:7/10:2:2:3, were ground together in an agate mortar for about 30 minutes. Pellets, 10 mm in diameter and about 3 mm thick, were pressed from this mixed powder. Two pellets were loaded into a gold tube (⅜" dia and 4" long) and the tube was sealed by welding both ends. The tube was placed in a furnace and heated at a rate of 5° C. per minute to 900° C. and then held at 900° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 120 K.

The X-ray powder diffraction of the product is essentially the same as that shown in Example 12.

EXAMPLES 12

1.1419 g of Tl$_2$O$_3$, 1.1960 g of PbO$_2$, 1.4416 g of CaO$_2$, 2.3924 g of SrO$_2$ and 2.3862 g of CuO, corresponding to a Tl:Pb:Ca:Sr:Cu atomic ratio of $\frac{1}{2}$:$\frac{1}{2}$:2:2:3, were ground together in an agate mortar for about 30 minutes. Pellets, 10 mm in diameter and about 3 mm thick, were pressed from this mixed powder. Two pellets were loaded into a gold tube ($\frac{3}{8}$" dia and 4" long) and the tube was sealed by welding both ends. The tube was placed in a furnace and heated at a rate of 5° C. per minute to 900° C. and then held at 900° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 120 K.

The d-spacings, the relative intensities and the indices of the observed reflections of the X-ray powder diffraction pattern of the product, which was essentially single phase, is shown in Table I. This is the characteristic pattern of the 15 Angstrom phase.

TABLE I

| d-spacing, nm | Intensity | hkl |
| --- | --- | --- |
| 1.530 | s | 001 |
| 0.760 | m | 002 |
| 0.5097 | m | 003 |
| 0.3811 | m | 004 |
|  |  | 100 |
| 0.3704 | w | 101 |
| 0.3400 | m | 102 |
| 0.3049 | m | 103 |
| 0.2698 | vs | 104 |
|  |  | 110 |
| 2.652 | w | 111 |
| 2.541 | m | 006 |
| 2.178 | w | 007 |
| 2.022 | w | 115 |
| 1.907 | m | 200 |
| 1.852 | w | 116 |
| 1.707 | w | 108 |
| 1.694 | m | 117 |
| 1.618 | w | 213 |
| 1.558 | m | 218 | w — weak
m — medium
s — strong

EXAMPLES 13

1.5986 g of Tl$_2$O$_3$, 0.6696 g of PbO$_2$, 1.4416 g of CaO$_2$, 2.3924 g of SrO$_2$ and 2.3862 g of CuO, corresponding to a Tl:Pb:Ca:Sr:Cu atomic ratio of 7/10:3/10:2:2:3, were ground together in an agate mortar for about 30 minutes. Pellets, 10 mm in diameter and about 3 mm thick, were pressed from this mixed powder. Two pellets were loaded into a gold tube ($\frac{3}{8}$" dia and 4" long) and the tube was sealed by welding both ends. The tube was placed in a furnace and heated at a rate of 5° C. per minute to 900° C. and then held at 900° C. for 6 hours. Power to the furnace was then shut off and the tube was allowed to cool to room temperature in the furnace. The tube was then removed from the furnace and cut open. The black product was recovered.

Meissner effect measurements showed the onset of superconductivity at about 110 K.

The X-ray powder diffraction of the product is essentially the same as that shown in Example 12.

EXAMPLES 14

2.0553 g of Tl$_2$O$_3$, 0.22319 g of PbO$_2$, 1.4416 g of CaO$_2$, 2.3924 g of SrO$_2$ and 2.3862 g of CuO, corresponding to a Tl:Pb:Ca:Sr:Cu atomic ratio of 9/10:1/10:2:2:3, were ground together in an agate mortar for about 30 minutes. Pellets, 10 mm in diameter and about 3 mm thick, were pressed from this mixed powder. Two pellets were loaded into a gold tube ($\frac{3}{8}$" dia and 4" long) and the tube was sealed by welding both ends. The tube was placed in a furnace and heated at a rate of 5° C. per minute to 900° C. and then held at 900° C. for 6 hours. Power to the furnace was then shut off and the tube was allowed to cool to room temperature in the furnace. The tube was then removed from the furnace and cut open. The black product was recovered.

Meissner effect measurements showed the onset of weak superconductivity at about 85 K.

The X-ray powder diffraction of the product showed the presence of a minor amount of the 12 Angstrom phase.

EXAMPLES 15

2.2838 g of Tl$_2$O$_3$, 1.1960 g of PbO$_2$, 1.1412 g of CaO$_2$, 2.3924 g of SrO$_2$ and 2.3862 g of CuO, corresponding to a Tl:Pb:Ca:Sr:Cu atomic ratio of 1:$\frac{1}{2}$:3/2:2:3, were ground together in an agate mortar for about 30 minutes. Pellets, 10 mm in diameter and about 3 mm thick, were pressed from this mixed powder. Two pellets were loaded into a gold tube ($\frac{3}{8}$" dia and 4" long) and the tube was sealed by welding both ends. The tube was placed in a furnace and heated at a rate of 5° C. per minute to 900° C. and then held at 900° C. for 6 hours. Power to the furnace was then shut off and the tube was allowed to cool to room temperature in the furnace. The tube was then removed from the furnace and cut open. The black product was recovered.

Meissner effect measurements showed two superconductivity transitions, one at about 116 K. and one at about 80 K.

The X ray powder diffraction pattern of the product showed the presence of both the 12 and the 15 Angstrom phases.

We claim:

1. A process for preparing a superconducting composition of the nominal formula Tl$_e$Pb$_a$Ca$_b$Sr$_c$Cu$_d$O$_x$ wherein a is from about 1/10 to about 3/2, b is from about 1 to about 4, c is from about 1 to about 3, d is from about 1 to about 5, e is from about 3/10 to about 1 and $x=(a+b+c+d+e+y)$ where y is from about $\frac{1}{2}$ to about 3, said process consisting essentially of
    (i) forming a mixture of oxides of Tl, Pb, Ca, Sr and Cu, the relative amounts of said oxides chosen so that the atomic ratio of Tl:Pb:Ca:Sr:Cu is e:a:b:c:d;
    (ii) heating said mixture of oxides to a temperature of about 850° C. to about 940° C. in a controlled atmosphere and maintaining the mixture at said temperature in said atmosphere for about 3 to 12 hours to form said composition; and
    (iii) cooling and recovering said composition.

2. The process of claim 1 wherein the controlled atmosphere is provided by placing, prior to heating, said mixture of oxides in a tube made of a non-reacting metal and then sealing the tube by welding.

3. The process of claim 2 wherein the non-reacting metal is gold.

4. The process of claim 1 wherein said mixture of oxides is heated to a temperature of about 860° C. to about 925° C.

5. The process of claim 3 wherein said mixture of oxides is heated to a temperature of about 860° C. to about 925° C.

6. The process of claim 4 wherein a+e is about 1, b and c are about 2 and d is about 3.

7. The process of claim 5 wherein a+e is about 1, b and c are about 2 and d is about 3.

8. The process of claim 6 wherein $e=\frac{1}{2}$, $a=\frac{1}{2}$, $b=2$, $c=2$ and $d=3$.

9. The process of claim 7 wherein $e=\frac{1}{2}$, $a=\frac{1}{2}$, $b=2$, $c=2$ and $d=3$.

10. The process of claim 6 wherein $e=3/10$, $a=7/10$, $b=2$, $c=2$ and $d=3$.

11. The process of claim 7 wherein $e=3/10$, $a=7/10$, $b=2$, $c=2$ and $d=3$.

12. The process of claim 6 wherein $e=7/10$, $a=3/10$, $b=2$, $c=2$ and $d=3$.

13. The process of claim 7 wherein $e=7/10$, $a=3/10$, $b=2$, $c=2$ and $d=3$.

14. An improved device based on the Josephson effect wherein the superconducting material comprises the composition of the nominal formula $Tl_e Pb_a Ca_b Sr_c Cu_d O_x$ wherein a is from about 1/10 to about 3/2, b is from about 1 to about 4, c is from about 1 to about 3, d is from about 1 to about 5, e is from about 3/10 to about 1 and $x=(a+b+c+d+e+y)$ where y is from about $\frac{1}{2}$ to about 3.

15. The device of claim 14 wherein the device is a SQUID.

* * * * *